(12) United States Patent
Roehr et al.

(10) Patent No.: US 8,051,707 B2
(45) Date of Patent: Nov. 8, 2011

(54) SENSOR ARRANGEMENT

(75) Inventors: Michael Roehr, Dortmund (DE);
Thomas Weber, Lüdenscheid (DE);
Frank Hagen, Lüdenscheid (DE)

(73) Assignee: Leopold Kostal GmbH & Co. KG,
Luedenscheid (DE)

( * ) Notice: Subject to any disclaimer, the term of this patent is extended or adjusted under 35 U.S.C. 154(b) by 0 days.

(21) Appl. No.: 12/941,223

(22) Filed: Nov. 8, 2010

(65) Prior Publication Data

US 2011/0061445 A1    Mar. 17, 2011

Related U.S. Application Data

(63) Continuation of application No. PCT/EP2009/057459, filed on Jun. 16, 2009.

(30) Foreign Application Priority Data

Jun. 18, 2008   (DE) .......................... 10 2008 028 977

(51) Int. Cl.
*G01W 1/00* (2006.01)
(52) U.S. Cl. ..................................... 73/170.17; 356/445
(58) Field of Classification Search .................. None
See application file for complete search history.

(56) References Cited

U.S. PATENT DOCUMENTS

| | | | | |
|---|---|---|---|---|
| 6,810,729 | B2* | 11/2004 | Sautter et al. | 73/170.17 |
| 7,296,461 | B2* | 11/2007 | Barguirdjian et al. | 73/73 |
| 7,446,427 | B2* | 11/2008 | Parker et al. | 307/10.1 |
| 7,716,981 | B2  | 5/2010  | Schmitt et al. | |
| 2003/0074962 | A1* | 4/2003 | Sautter et al. | 73/170.17 |
| 2007/0044542 | A1* | 3/2007 | Barguirdjian et al. | 73/73 |
| 2008/0223127 | A1  | 9/2008 | Schmitt et al. | |
| 2009/0134985 | A1  | 5/2009 | Schmitt et al. | |
| 2009/0161109 | A1* | 6/2009 | Wolf et al. | 356/445 |

FOREIGN PATENT DOCUMENTS

| | | |
|---|---|---|
| DE | 3827937 A1 | 2/1990 |
| DE | 202006010426 U1 | 8/2006 |
| DE | 102006032372 A1 | 2/2007 |
| DE | 102006022404 A1 | 11/2007 |
| DE | 102006060546 A1 | 6/2008 |
| DE | 102006060547 A1 | 6/2008 |
| DE | 102006060548 A1 | 6/2008 |
| WO | 2008014911 A1 | 2/2008 |

* cited by examiner

*Primary Examiner* — Andre Allen
(74) *Attorney, Agent, or Firm* — Brooks Kushman P.C.

(57) ABSTRACT

A sensor arrangement includes an optical sensor, a non-optical sensor, a sensor holder, and main and flexible interconnect devices. The sensor arrangement can be fixed to a vehicle window by the sensor holder. The sensor holder is in the form of a sensor housing having a sensor housing cover and a second housing body attached to one another. The sensor housing cover and the sensor housing body each have corresponding bracket sections which form a bracket connected to the sensor housing. The main interconnect device is positioned within the sensor housing. The optical sensor is connected to the main interconnect device. The flexible interconnect device is connected to the main interconnect device and extends from the main interconnect device to the bracket connected to the sensor housing. The non-optical sensor is connected to the flexible interconnect device within the bracket and is held by the bracket.

20 Claims, 4 Drawing Sheets

SENSOR ARRANGEMENT

CROSS-REFERENCE TO RELATED APPLICATIONS

This application is a continuation of International Application No. PCT/EP2009/057459, published in German, with an international filing date of Jun. 16, 2009, which claims priority to DE 10 2008 028 977.9, filed Jun. 18, 2008; the disclosures of which are both incorporated by reference.

BACKGROUND

The present invention relates to a sensor arrangement having an optical sensor, a non-optical sensor, and a sensor holder in which the non-optical sensor is held by a bracket that is connected to the sensor holder and in which the sensor arrangement can be mounted to a vehicle window by the sensor holder.

BACKGROUND

DE 20 2006 010 426 U1 describes a sensor holder which is fabricated as a press bent part. The sheet metal frame that forms the sensor holder can be latched with a support piece connected to a vehicle window. The sensor holder attaches a rain sensor centrally. The sensor holder has a molded elastic retaining tongue that projects to the side. The tongue holds a condensation sensor which is miniaturized in comparison with the rain sensor. It is not clear from DE '426 how a cover piece surrounding the sensor mechanism can be fabricated in an advantageous manner. Further, DE '426 lacks information regarding how the electrical connection of the condensation sensor could be achieved advantageously.

SUMMARY

An object of the present invention is a sensor arrangement having an optical sensor and a non-optical sensor in which the sensor arrangement is characterized by a simple and cost-effective overall assembly process and by an advantageously designed electrical connection to the sensors.

In carrying out the above object and other objects, the present invention provides a sensor arrangement having an optical sensor and a non-optical sensor. The sensor arrangement further includes a sensor housing cover and a sensor housing body. The sensor housing cover and the sensor housing body are attached to one another to form a sensor housing attachable to a vehicle window. The sensor housing cover and the sensor housing body each having corresponding bracket sections which form a bracket connected to the sensor housing. The sensor arrangement further includes a main interconnect device and a flexible interconnect device. The main interconnect device is positioned within the sensor housing. The optical sensor is connected to the main interconnect device. The flexible interconnect device is connected to the main interconnect device and extends from the main interconnect device to the bracket connected to the sensor housing. The non-optical sensor is connected to the flexible interconnect device within the bracket and is held by the bracket.

Embodiments of the present invention provide a sensor arrangement having at least one optical sensor and at least one non-optical sensor which can be fixed to a vehicle window by a sensor holder. The non-optical sensor is held by a bracket connected to the sensor holder. The sensor holder is embodied as a sensor housing including a sensor housing body and a sensor housing cover. The sensor housing receives a main circuit carrier to which parts of the optical sensor are connected. The non-optical sensor is connected to the main circuit carrier by a flexible circuit carrier.

In general, a sensor arrangement in accordance with embodiments of the present invention includes an optical sensor, a non-optical sensor, a sensor holder, a main interconnect device such as a printed circuit board (PCB), and a flexible interconnect device such as a foil conductor or a flexible printed circuit substrate. The sensor holder is embodied as a sensor housing having a sensor housing body and a sensor housing cover. The sensor housing accommodates the main interconnect device. The optical sensor is connected to the main interconnect device. The non-optical sensor is connected to the flexible interconnect device. The flexible interconnect device is connected to the main interconnect device such that the non-optical sensor is connected to the main interconnect device and such that the optical sensor and the non-optical sensor are connected to each other.

The sensor arrangement in accordance with embodiments of the present invention is characterized by the optical and non-optical sensors being mounted such that they are distributed among a plurality of interconnect devices (i.e., the main and flexible interconnect devices) with the non-optical sensor being arranged on the flexible interconnect device. The sensors form an electrical unit through the connection of the flexible interconnect device to the main interconnect device. The main interconnect device can be contacted through a common electrical interface of the sensor arrangement.

The main and flexible interconnect devices can be connected to the sensor housing as a pre-mounted mechanical unit. No close tolerances with respect to the positioning of the sensors relative to one another may need to be maintained as the flexible connection between the sensors can compensate for any tolerances.

The flexible interconnect device may enable an elastic mounting of the non-optical sensor on the bracket of the sensor housing in a simple manner.

The bracket of the sensor housing is formed as a component of the sensor housing instead of being formed as a separate part to be attached. In particular, the bracket of the sensor housing is formed as an integral section of both of the sensor housing body and the sensor housing cover.

An advantage of the sensor assembly in accordance with embodiments of the present invention may be that the entire sensor arrangement can be fabricated by joining only a relatively small number of individual components by modular assembly.

Another advantage of the sensor assembly in accordance with embodiments of the present invention may be that the main and flexible interconnect devices can be pre-mounted with one another in the sensor housing before assembly. The two interconnect devices can thus be connected to one another electrically and mechanically in a simple and cost-effective manner, such as with a soldered connection, and added as a component to the sensor housing in a simple manner.

The electrical connection of the two interconnect devices can be made with a plug-and-socket connector. The interconnect devices can thus be connected to one another either before or after assembly on the sensor housing if necessary. This enables a subsequent exchange of one of the interconnect devices and the accompanying sensor to be carried out simply at any time.

The non-optical sensor may be advantageously arranged by being held by bars molded into the bracket of the sensor housing and pressed against the vehicle window by a spring.

In an embodiment, the optical sensor is at least one of a rain sensor and a light sensor. In an embodiment, the non-optical sensor is either a condensation sensor or a combination of a temperature sensor and a humidity sensor.

The above features, and other features and advantages of the present invention are readily apparent from the following detailed descriptions thereof when taken in connection with the accompanying drawings.

DETAILED DESCRIPTION

Figure 1:
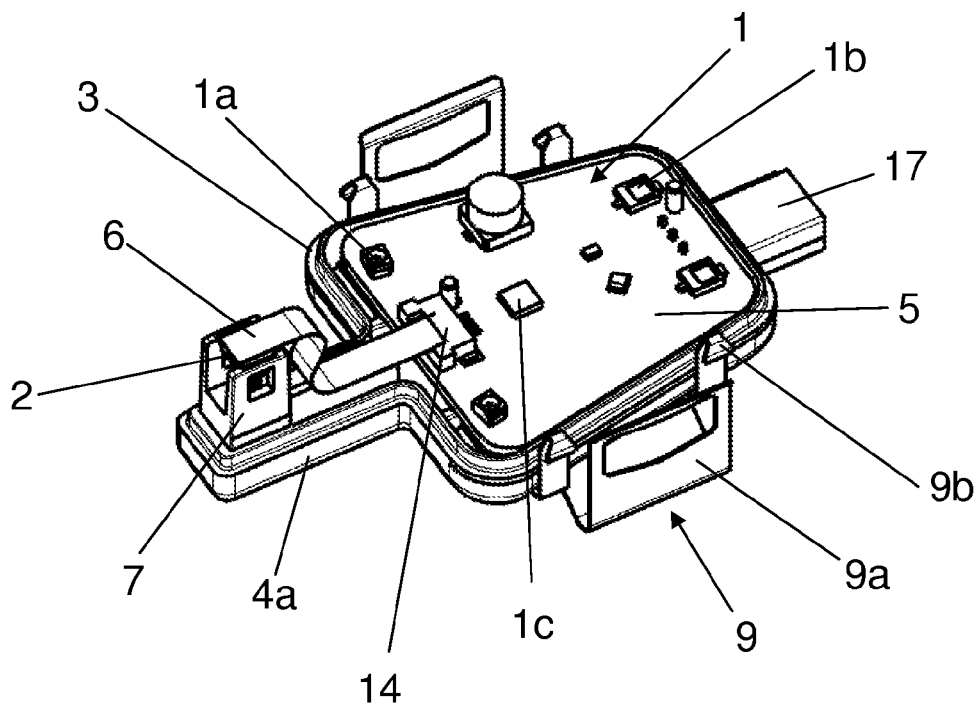
FIG. 1 illustrates a view of a sensor arrangement in accordance with an embodiment of the present invention with the sensor housing body of the sensor housing of the sensor arrangement being removed therefrom.
Figure 2:
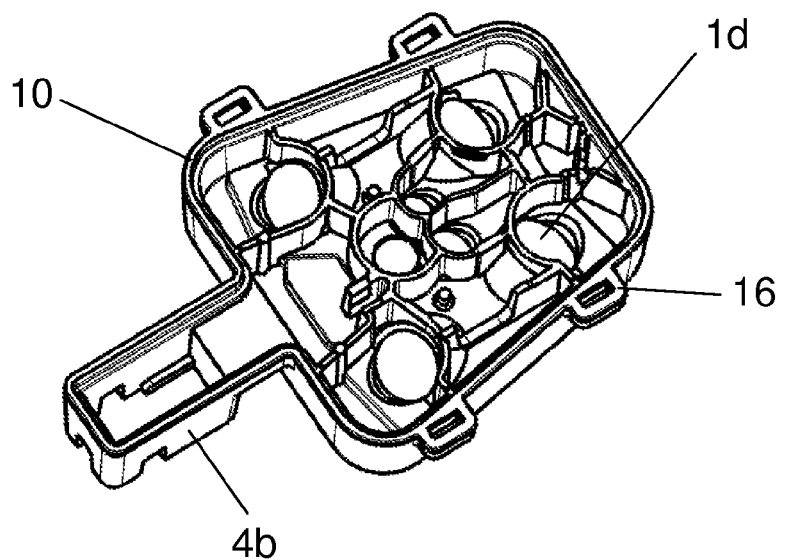
FIG. 2 illustrates a view of the sensor arrangement with the sensor housing cover of the sensor housing of the sensor arrangement being removed therefrom.

Referring now to FIGS. 1 and 2, a sensor arrangement in accordance with an embodiment of the present invention will be described. The sensor arrangement includes an optical sensor(s) 1, a non-optical sensor(s) 2, a sensor holder, a main interconnect device 5, and a flexible interconnect device 6. The sensor arrangement is fixable to a vehicle window or the like via the sensor holder.

Optical sensor 1 includes a plurality of electronic components such as a light transmitter 1a and a plurality of light receivers 1b, 1c. Optical sensor 1 is formed, for example, as a combined rain and light sensor. Non-optical sensor 2 is formed, for example, as at least one of a condensation sensor, a temperature sensor, and a humidity sensor.

The sensor holder is embodied as a sensor housing 13 (indicated in FIGS. 3 and 4) having a sensor housing cover 3 (shown in FIG. 1) and a sensor housing body 10 (shown in FIG. 2). Sensor housing cover 3 attaches to sensor housing body 10 in order to form the assembled sensor housing 13. FIGS. 1 and 2 each illustrate views of the sensor arrangement with sensor housing 13 being disassembled. That is, FIGS. 1 and 2 each illustrate views of the sensor arrangement with sensor housing cover 3 being removed from sensor housing body 10. FIG. 1 illustrates an internal view of sensor housing cover 3 (i.e., FIG. 1 illustrates a view of the sensor arrangement with sensor housing body 10 being removed therefrom). FIG. 2 illustrates an internal view of sensor housing body 10 (i.e., FIG. 2 illustrates a view of the sensor arrangement with sensor housing cover 3 being removed therefrom).

Figure 3:
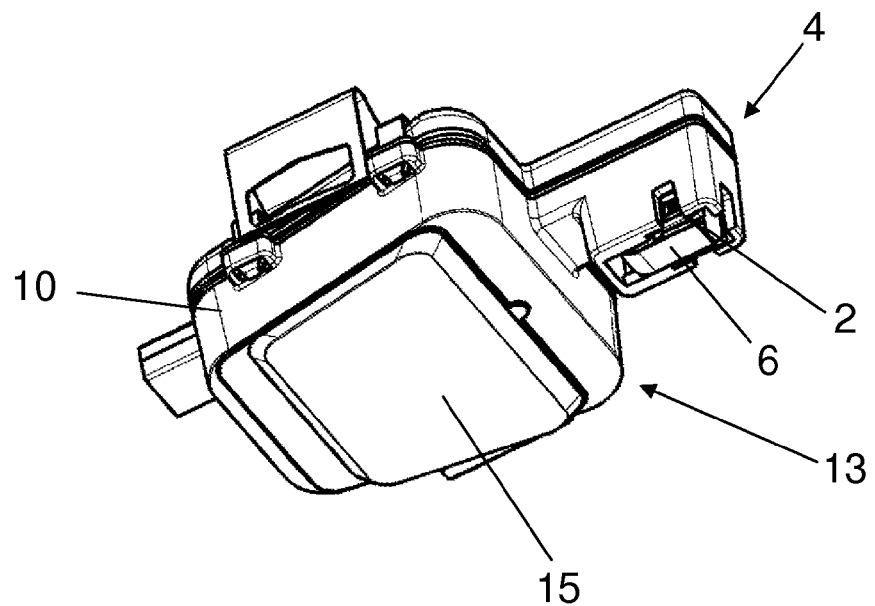
FIG. 3 illustrates a perspective view of the sensor arrangement looking up towards the sensor housing body.
Figure 4:
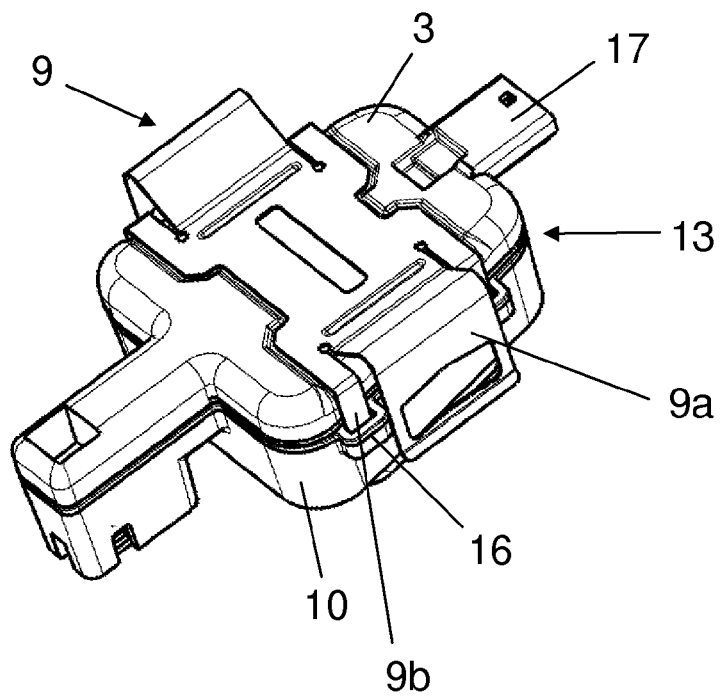
FIG. 4 illustrates a perspective view of the sensor arrangement looking down towards the sensor housing cover.

Sensor housing cover 3 and sensor housing body 10 respectively include corresponding bracket sections 4a, 4b. Bracket sections 4a, 4b form a bracket 4 of sensor housing 13 when sensor housing 13 is assembled upon sensor housing cover 3 being attached to sensor housing body 10 (as shown in FIGS. 3 and 4). In particular, bracket section 4b of sensor housing body 10 surrounds bracket section 4a of sensor housing cover 3 and bracket sections 4a, 4b together form bracket 4 of sensor housing 13 when sensor housing cover 3 is attached to sensor housing body 10 (this is particularly clearer in FIG. 6).

Main interconnect device 5 may be in the form of a printed circuit board (PCB). PCB 5 is accommodated within sensor housing 13. In particular, PCB 5 is inserted into a frame shaped section of sensor housing cover 3. PCB 5 holds electronic components 1a, 1b, and 1c of optical sensor 1. PCB 5 holds additional electronic components (not shown in detail) which form an evaluation circuit for sensor signals. PCB 5 also forms a connection to an electrical interface 17 of the sensor arrangement. Electrical interface 17 is designed as a plug-and-socket connector on the outside of sensor housing cover 3 through which the output signals from the sensor arrangement can be accessed.

Flexible interconnect device 6 may be in the form of a foil conductor or a flexible circuit board. Flexible interconnect device 6 may be designed as a so-called Starflex conductor plate having rigid regions along with flexible sections.

The upper side of PCB 5 accommodates a plug-and-socket connector 14. PCB 5 and flexible interconnect device 6 are electrically connected to one another via plug-and-socket connector 14.

During the assembly process of the sensor arrangement, PCB 5 and flexible interconnect device 6 can be pre-assembled with one another and joined together at sensor housing cover 3. This gives rise to a readily manageable component that can then be connected in a simple manner with sensor housing body 10 to form the sensor arrangement.

Flexible interconnect device 6 is routed from plug-and-socket connector 14 to bracket section 4a formed on sensor housing cover 3. Bracket section 4a includes a pair of bars 7 which stand upright perpendicular from bracket section 4a towards bracket section 4b of sensor housing body 10. Bars 7 are parallel to one another. As described in greater detail below with respect to FIGS. 5 and 6, the end of flexible interconnect device 6 routed to bracket section 4a extends through bars 7 and bars 7 elastically hold non-optical sensor 2. Non-optical sensor 2 is connected to the end of flexible interconnect device 6 whereby non-optical sensor 2 is connected to main interconnect device 5 via flexible interconnect device 6 and plug-and-socket connector 14. As indicated, optical sensor 1 is also connected to main interconnect device 5.

As shown in FIG. 2, sensor housing body 10 has a joined or molded light conducting arrangement 1d. Light conducting arrangement 1d together with electronic components 1a, 1b, and 1c of optical sensor 1 in conjunction with a coupling surface 15 (shown in FIG. 3) of sensor housing body 10 form a plurality of optical sensors. Light conducting arrangement 1d sets up light circuits between light transmitter(s) 1a and light receiver(s) 1b through which moistening of the vehicle window, of which the sensor arrangement is fixed to, can be optically detected. An additional light receiver 1c of optical sensor 1 receives light conducted from the vehicle surroundings through light conducting arrangement 1d and thereby detects the brightness level outside the vehicle.

As further shown in FIG. 2, sensor housing body 10 includes a plurality of latching eyelets 16. Latching eyelets 16 are molded on corresponding edges of sensor housing body 10.

As indicated in FIG. 1 (and as shown in greater detail in FIG. 4), sensor housing cover 3 includes a bracket 9. Bracket 9 includes a pair of first spring hooks 9a and a plurality of second spring hooks 9b. Second spring hooks 9b penetrate in a latching manner with corresponding ones of latching eyelets 16 of sensor housing body 10 when sensor housing cover 3 is attached to sensor housing body 10 to form the assembled sensor housing 13.

Referring now to FIGS. 3 and 4, with continual reference to FIGS. 1 and 2, perspective views of the sensor arrangement are shown. As indicated above, the sensor arrangement can be attached to a support piece (not shown) that is connected to a vehicle window (not shown) in order to be fixed to the vehicle window. Alternatively, the sensor arrangement can be glued to the vehicle window.

FIG. 3 illustrates a perspective view of the sensor arrangement looking up towards sensor housing body 10. This side of sensor housing 13 which has sensor housing body 10 faces the vehicle window when the sensor arrangement is fixed to the vehicle window. Sensor housing body 10 includes coupling surface 15 on its outer side. Coupling surface 15 couples optical sensor 1 to the vehicle window. Coupling surface 15 is made, for example, of silicon. The end of flexible interconnect device 6 which is inside bracket 4 formed on sensor housing 13 is pressed against the vehicle window by a compression spring 11 (shown in FIGS. 5 and 7) located inside bracket 4. This end of flexible interconnect device 6 holds the side of non-optical sensor 2 facing the interior of sensor housing 13.

FIG. 4 illustrates a perspective view of the sensor arrangement looking down towards sensor housing cover 3. As indicated, sensor housing cover 3 includes bracket 9 which has the pair of first spring hooks 9a and the plurality of second spring hooks 9b. First spring hooks 9a connect sensor housing 13 with a support piece (not shown) attached to the vehicle window in order to fix the sensor arrangement to the vehicle window. As noted above, second spring hooks 9b of bracket 9 project into latching eyelets 16 of sensor housing body 10 in order to connect sensor housing cover 3 and sensor housing body 10 together to form the assembled sensor housing 13. In particular, second spring hooks 9b project into latching eyelets 16 in a latching manner thereby causing elastic bracket 9 to press sensor housing cover 3 against sensor housing body 10.

Figure 5:
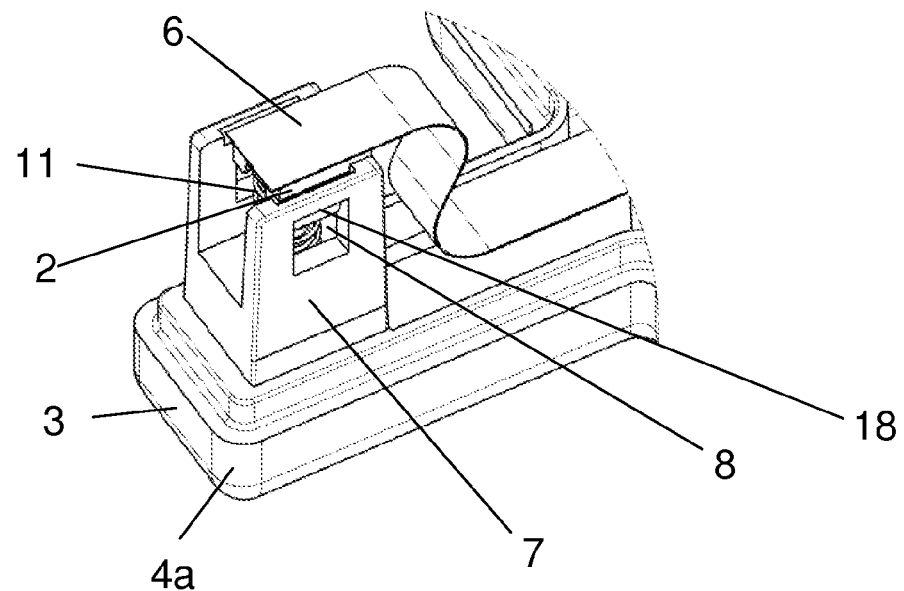
FIG. 5 illustrates a view of the mounting of the non-optical sensor of the sensor arrangement on the bracket of the sensor housing with the sensor housing body being removed therefrom.
Figure 6:
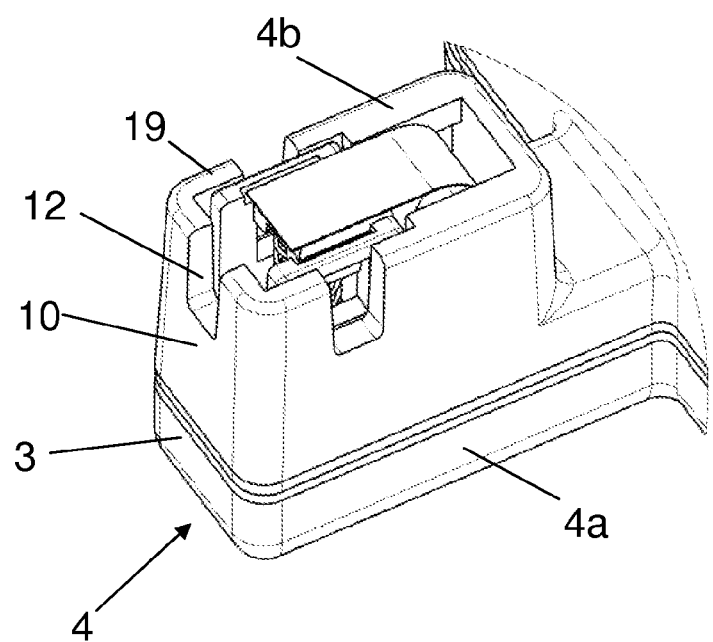
FIG. 6 illustrates a view according to FIG. 5 with the sensor housing cover and the sensor housing body attached to one another.
Figure 7:
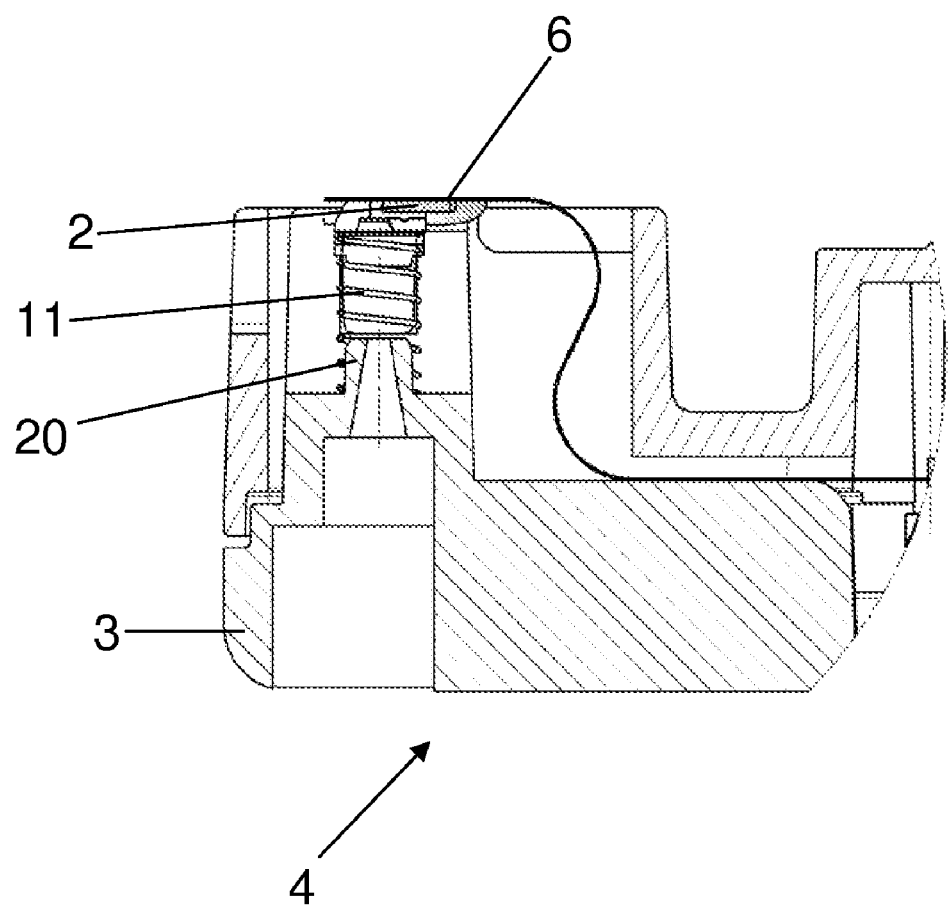
FIG. 7 illustrates a cross-sectional view of the view shown in FIG. 6.

Referring now to FIGS. 5, 6, and 7, with continual reference to FIGS. 1 through 4, the mounting of non-optical sensor 2 on bracket 4 of sensor housing 13 will be described in greater detail. FIG. 5 illustrates the area of the sensor arrangement associated with bracket section 4a of sensor housing cover 3 with sensor housing body 10 being removed therefrom. FIG. 6 illustrates a view according to FIG. 5 with sensor housing 10 assembled (i.e., with sensor housing cover 3 and sensor housing body 10 attached to one another). FIG. 7 illustrates a cross-sectional view of the view shown in FIG. 6.

As shown in FIG. 5, bars 7 on bracket section 4a of sensor housing cover 3 each have a recess 8 and non-optical sensor 2 has corresponding clip-type sections 18. Clip-type sections 18 of non-optical sensor 2 insert into recesses 8 of bars 7. Clip-type sections 18 can be displaced in the vertical direction along recesses 8. Compression spring 11, located between bars 7, pushes non-optical sensor 2 away from the base surface of bracket section 4a. As a result, non-optical sensor 2 and the end of flexible interconnect device 6 connected to the non-optical sensor protrude a bit over the upper edge sections of bars 7.

As shown in FIG. 6, in which sensor housing 13 is assembled, bracket section 4b of sensor housing body 10 extends beyond bars 7. Sensor housing body 10 stabilizes bars 7 and helps prevent clip-type sections 18 of non-optical sensor 2 from slipping out of recesses 8 of bars 7. Bars 7 are surrounded by sensor housing body 10 for this reason. Furthermore, ribs (not shown) on sensor housing body 10 join between bars 7 and hinder the inward bending of bars 7 to thereby hinder the clamping of non-optical sensor 2 located between bars 7. Non-optical sensor 2 and flexible interconnect device 6 extend beyond upper edging 19 of sensor housing body 10. Because edging 19 of sensor housing body 10 lies next to the vehicle window after the assembly of sensor housing 13, the outer side of flexible interconnect device 6 is pressed against the vehicle window by compression spring 11. As a result, non-optical sensor 2 arranged on the back side of flexible interconnect device 6 is thermally well coupled to the vehicle window. This is useful when non-optical sensor 2 includes a temperature sensor.

As non-optical sensor 2 may include an air humidity sensor, the side walls of sensor housing body 10 include openings 12 around non-optical sensor 2. Openings 12 assist in ventilating the humidity sensor.

An evaluation circuit identifies the instantaneous tendency toward condensation from the combined measured values of window temperature and air humidity such that even prior to the occurrence of condensation on the vehicle window an appropriate response can be initiated.

For further clarification, FIG. 7 illustrates a cross-sectional view through the assembly shown in FIG. 6. Compression spring 11, shown in greater detail in FIG. 7, is mounted on a dome 20 molded on sensor housing cover 3. The relatively narrow cross-section of flexible interconnect device 6 enables non-optical sensor 2 to couple to the vehicle window through flexible interconnect device 6. The flexible construction of flexible interconnect device 6 also enables the use of the spring mounted assembly of non-optical sensor 2.

REFERENCE SYMBOLS

1 optical sensor
1a light transmitter
1b, 1c light receivers
1d light conducting arrangement
2 non-optical sensor
3 sensor housing cover
4 bracket
4a, 4b bracket sections
5 main interconnect device (e.g., printed circuit board)
6 flexible interconnect device (e.g., conductor foil)
7 bars
8 recesses of bars (for clipping in the non-optical sensor)
9 bracket
9a first spring hooks
9b second spring hooks
10 sensor housing body
11 compression spring
12 ventilation openings
13 sensor housing
14 plug-and-socket connector
15 coupling surface
16 latching eyelets
17 electrical connection
18 clip-like sections of the non-optical sensor
19 edging
20 dome As required, detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A sensor arrangement comprising:
an optical sensor;
a non-optical sensor;
a sensor housing cover and a sensor housing body attached to one another to form a sensor housing attachable to a window, the sensor housing cover and the sensor housing body each having corresponding bracket sections which form a bracket connected to the sensor housing;
a main interconnect device positioned within the sensor housing, wherein the optical sensor is connected to the main interconnect device; and
a flexible interconnect device connected to the main interconnect device and extending from the main interconnect device to the bracket connected to the sensor housing, wherein the non-optical sensor is connected to the flexible interconnect device within the bracket and is held by the bracket.

2. The sensor arrangement of claim 1 wherein:
the main interconnect device is a printed circuit board.

3. The sensor arrangement of claim 1 wherein:
the flexible interconnect device is one of a foil conductor and a flexible printed circuit substrate.

4. The sensor arrangement of claim 1 wherein:
the optical sensor forms at least one of a rain sensor and a light sensor.

5. The sensor arrangement of claim 1 wherein:
the non-optical sensor is operable to detect formation of condensation.

6. The sensor arrangement of claim 1 wherein:
the non-optical sensor is operable to detect impending condensation on prior to definite formation of condensation.

7. The sensor arrangement of claim 1 wherein:
the non-optical sensor includes at least one of a temperature sensor and a humidity sensor.

8. The sensor arrangement of claim 1 further comprising:
a spring mounted on the bracket, wherein the spring presses the non-optical sensor in the direction of the window when the sensor housing is attached to the window.

9. The sensor arrangement of claim 1 wherein:
the section of the flexible interconnect device provided with the non-optical sensor rests against the window when the sensor housing is attached to the window.

10. The sensor arrangement of claim 1 further comprising:
a pair of bars attached to the bracket section of the sensor housing cover, wherein the bars hold the non-optical sensor for the non-optical sensor to be held by the bracket.

11. The sensor arrangement of claim 10 wherein:
each bar includes a recess and the non-optical sensor includes corresponding clip-like sections, wherein the clip-like sections of the non-optical sensor clip into the recesses of the bars in order for the non-optical sensor to be held by the bracket.

12. The sensor arrangement of claim 10 wherein:
the bars are aligned parallel to one another.

13. The sensor arrangement of claim 10 wherein:
the bars are surrounded at least partially by the sensor housing body when the sensor housing cover and the sensor housing body are attached to one another to form the sensor housing.

14. The sensor arrangement of claim 10 wherein:
the sensor housing body includes openings in the region of the sensor housing body surrounding the bars for ventilating the non-optical sensor.

15. The sensor arrangement of claim 1 wherein:
the main interconnect device includes a plug-and-socket connector, wherein the flexible interconnect device is connected to the main interconnect device via the plug-and-socket connector.

16. The sensor arrangement of claim 1 wherein:
the non-optical sensor is mounted with a spring on the bracket.

17. The sensor arrangement of claim 1 wherein:
the sensor housing cover includes a pair of first spring hooks, wherein the first spring hooks are attachable to a support piece attached to the window such that the sensor housing is attachable to the window.

18. The sensor arrangement of claim 17 wherein:
the sensor housing cover further includes a plurality of second spring hooks and the sensor housing body includes a plurality of latching eyelets;
wherein the second spring hooks of the sensor housing cover project into the latching eyelets of the sensor housing body in order to attach the sensor housing cover and the sensor housing body to one another and thereby form the sensor housing.

19. The sensor arrangement of claim 1 wherein:
the sensor housing body includes a coupling surface which faces the window when the sensor housing is attached to the window, the coupling surface for coupling light into the optical sensor.

20. The sensor arrangement of claim 1 wherein:
the main interconnect device includes a plug-and-socket connector extending through the outside of the sensor housing cover.

* * * * *